US008809076B2

United States Patent
Yoshimi et al.

(10) Patent No.: US 8,809,076 B2
(45) Date of Patent: Aug. 19, 2014

(54) SEMICONDUCTOR DEVICE AND METHOD OF AUTOMATICALLY INSPECTING AN APPEARANCE OF THE SAME

(71) Applicant: Semiconductor Components Industries, LLC, Phoenix, AZ (US)

(72) Inventors: Hideaki Yoshimi, Ora-gun (JP); Shinzo Ishibe, Ora-gun (JP); Eiji Kurose, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 20 days.

(21) Appl. No.: 13/750,708

(22) Filed: Jan. 25, 2013

(65) Prior Publication Data

US 2013/0192078 A1  Aug. 1, 2013

(30) Foreign Application Priority Data

Jan. 27, 2012  (JP) ................. 2012-015311

(51) Int. Cl.
G01B 21/02 (2006.01)
H01L 21/66 (2006.01)
H01L 21/02 (2006.01)
H01L 21/78 (2006.01)

(52) U.S. Cl.
USPC ............. 438/16; 438/460; 438/462; 382/145; 257/778; 257/E21.599

(58) Field of Classification Search
USPC ............. 438/15, 106, 108, 16, 460, 462; 382/145; 257/778, E21.599
See application file for complete search history.

(56) References Cited

U.S. PATENT DOCUMENTS

2008/0251950 A1* 10/2008 Tanemura .................. 257/797
2009/0080762 A1* 3/2009 Kobayashi .................. 382/145

FOREIGN PATENT DOCUMENTS

JP  2011-14605  1/2011

* cited by examiner

Primary Examiner — Colleen Matthews
Assistant Examiner — Regan J Rundio
(74) Attorney, Agent, or Firm — Rennie William Dover

(57) ABSTRACT

The invention provides a semiconductor device and a method of automatically inspecting the appearance, which achieves proper recognition of the size of a chipping occurring from an end portion of the semiconductor device toward the element forming region by an automatic appearance inspection machine, and prevents a problem of judging an appearance non-defective product as an appearance defective product. A semiconductor device includes a resin layer extending from an element forming region over a guard ring surrounding the element forming region so as to cover these except a plurality of portions of the guard ring, and a chipping extending from a chip end portion of a semiconductor device toward the end portion of the resin layer. An end portion of the guard ring partially exposed from the resin layer is used as a reference to measure a distance y from the end portion of the guard ring to the end portion of the chipping and a distance x from the end portion of the guard ring to the end portion of the resin layer. The device is judged as an appearance non-defective product when y is larger than x or is judged as an appearance defective product when y is equal to x or y is smaller than x.

19 Claims, 7 Drawing Sheets

SEMICONDUCTOR DEVICE AND METHOD OF AUTOMATICALLY INSPECTING AN APPEARANCE OF THE SAME

CROSS-REFERENCE OF THE INVENTION

This application claims priority from Japanese Patent Application No. 2012-015311, filed Jan. 27, 2012, the content of which is incorporated herein by reference in its entirety.

BACKGROUND OF THE INVENTION

1. Field of the Invention

The invention relates to a semiconductor device and a method of automatically inspecting an appearance of a semiconductor device, particularly, a method of automatically inspecting an appearance for removing a WLP (Wafer Level chip size Package) Flip Chip with a chipping occurring in the interlayer insulation film or the semiconductor substrate from an end portion of the WLP Flip Chip toward the element forming region.

2. Description of the Related Art

As a semiconductor device to set in electronics, a semiconductor device having equivalent size to the semiconductor element set therein, called CSP, is employed, that satisfies demands for miniaturization, thinner thickness and lighter weight for use in a mobile data device such as a mobile phone. A WLP Flip Chip is particularly miniaturized one of CSP. FIG. 5 is an enlarged view of a portion of a scribe region 18b and an element foaming region 18a adjacent thereto in a semiconductor wafer 70 before a wafer is diced into WLP Flip Chips.

Although the details of reference numerals in FIG. 5 will be described below, multiple layers of a plurality of interlayer insulation films 4 etc and metal wiring layers 7 etc as well as a device element (not shown) etc are formed in the element forming region 18a, and a TEG wiring layer 41 etc, a plurality of interlayer insulation films 4 etc, and a device element (not shown) etc forming a TEG (Test Element Group) region 15 are formed in the scribe region 18b. The plurality of interlayer insulation films 4 etc in the element forming region 18a and the plurality of interlayer insulation films 4 etc in the scribe region 18b are connected.

However, since a passivation film 5 formed of a silicon nitride film etc is hard and fragile, stress by a dicing process easily causes a crack in the passivation film 5 in the scribe region 18b. Therefore, as shown in FIG. 5, in order to prevent a crack in the passivation film 5 in the scribe region 18b from extending to the passivation film 5 in the element forming region 18a, the passivation films 5 in both the regions are isolated by providing a passivation film removed groove 21 in the scribe region 18b. A first resin layer 6 extends from on a portion of the passivation film removed groove 21 onto the element foaming region 18a so as to cover these.

In this state, when the wafer is diced along a scribe line 19 as a center line into the WLP Flip Chips, chippings of various sizes may occur in the interlayer insulation film 4 etc or a semiconductor substrate 1 in an end portion of the diced WLP Flip Chip. When these chippings extend to the interlayer insulation film 4 etc or the semiconductor substrate 1 under the first resin layer 6 in the end portion of the WLP Flip Chip, these chippings may cause a crack in the interlayer insulation film 4 etc or the semiconductor substrate 1, and the crack may extend to inside the element forming region 18a. When a crack occurs in the interlayer insulation film 4 etc or the semiconductor substrate 1 in the element forming region 18a, the device characteristics of the WLP Flip Chip may decrease, causing a problem in the yield and reliability.

Therefore, WLP Flip Chips separated by dicing undergo an appearance inspection process and chips having a chipping of predetermined size or more etc are removed so as to minimize the problem in the yield and reliability. FIG. 6A shows a schematic plan view of a WLP Flip Chip 30 separated by dicing the semiconductor wafer 70 shown in FIG. 5.

The end portion 32 of the first resin layer 6 shown in FIG. 5 is shown inside the chip end portion 31 of the WLP Flip Chip 30. The first resin layer 6 extends from the end portion 32 and covers the surface of the WLP Flip Chip 30. A guard ring 17 shown in FIG. 5 is disposed inside the end portion 32 of the first resin layer 6, being covered with the first resin layer 6 as shown by a dotted line. The end portion 32 of the first resin layer 6 extends to the passivation film removed groove 21 outside a guard ring end portion 17a.

FIG. 6B is a plan view of the chip end portion 31 of the WLP Flip Chip 30 and the vicinity, showing a large chipping 34 occurring from the chip end portion 31 in the interlayer insulation film 4 etc, which is recognized as an appearance defective product by an appearance inspection. The appearance inspection is performed automatically by an automatic appearance inspection machine so as to reduce manpower. A chip of which a chipping end portion 34a extends to inside a judgment line 33 is judged as an appearance defective product. FIG. 6B also schematically shows the position of the scribe line 19 that is the center line of the dicing. The dicing is performed along the scribe line 19 as the center line, keeping a predetermined vertical width.

In principle, a chip is allowable as long as the chipping 34 has such size as not to extend to inside the end portion 32 of the first resin layer 6, and thus a non-defective or defective judgment is achieved by judging whether or not the chipping end portion 34a is in contact with the end portion 32 of the first resin layer 6. However, since the first resin layer 6 is formed by coating a liquid material such as polyimide, a resin easily flows and easily extends to the scribe line side, and the edge is often obscure.

For such a reason etc, when the end portion 32 of the first resin layer 6 is recognized by the automatic appearance inspection machine, the recognition accuracy varies largely. Therefore, the position of the unstable end portion 32 of the first resin layer 6 is not used for a non-defective/defective judgment by an appearance inspection. Instead, in order to avoid failing to find a defective product by an appearance inspection, the judgment line 33 is set in a position away from the end portion 32 of the first resin layer 6 recognized by the appearance inspection machine toward the chip end portion 31 by a predetermined value a, thereby making a non-defective or defective judgment by an appearance inspection. The judgment line 33 is set in a position away from the end portion 32 of the first resin layer 6 by about several μm.

FIG. 6C is an enlarged plan view of the chip end portion 31 of the WLP Flip Chip 30 and the vicinity, that is judged as a non-defective product by the appearance inspection machine. The end portion 34a of the chipping 34 lies in a position closer to the chip end portion 31 outside the judgment line 33. Therefore, the chipping 34 does not cause a crack extending to the element forming region 18a shown in FIG. 5 in the interlayer insulation film 4 etc.

In Japanese Patent Application publication No. 2011-014605, as shown in FIG. 7, in order to avoid connection between a plurality of interlayer insulation films 4 etc in an element forming region 18a and a plurality of interlayer insulation films 4 etc in a scribe region 18b, an insulation film removed groove 21a is provided in the scribe region 18b, in which an insulation film does not exist and a semiconductor substrate 1 is exposed. With this insulation film removed groove 21a, when a semiconductor wafer 80 is separated into individual WLP Flip Chips by dicing, a chipping 34 or a crack does not occur in the interlayer insulation film 4 etc from the chip end portion 31 toward the element forming region 18a.

In detail, Japanese Patent Application publication No. 2011-14605 discloses preventing a crack in the interlayer insulation film 4 etc in the element forming region 18a due to a chipping 34 occurring in the interlayer insulation film 4 etc in the chip end portion 31. However, a chipping 34 occurs in the semiconductor substrate 1, and thus it is necessary to remove a chipping 34 having predetermined size or more by an appearance inspection machine as described above. It is noted that the same reference numerals among FIG. 5, FIG. 6 and FIG. 7 etc show the same components.

By the automatic appearance inspection of the WLP Flip Chip 30 described above, even when the end portion 32 of the first resin layer 6 is not in contact with the end portion 34a of the chipping 34 extending from the chip end portion 31 and does not have a practical problem, there is a case where the WLP Flip Chip 30 is judged as a defective product. This will be described referring to FIG. 6D.

When a pattern is formed in the first resin layer 6 after the first resin layer 6 made of polyimide etc is coated on the semiconductor wafer, an exposure machine having low mask alignment accuracy is often used without a mask alignment machine having high accuracy such as a stepper. This is to decrease the manufacturing cost since the pattern of the first resin layer 6 is not miniaturized one.

Therefore, there is a case where the amount of a mask misalignment is several μm or more, and the first resin layer 6 may be formed with the end portion 32 largely shifted toward the chip end portion 31 as shown in FIG. 6D. The amount of a mask misalignment in this case is apparent by comparing this with the position of the end portion 32 of the first resin layer 6 in FIG. 6C. As a result, the judgment line 33 crosses the chipping 34 and the WLP Flip Chip 30 is judged as an appearance defective product, thereby decreasing the yield in the appearance inspection process.

However, the end portion 34a of the chipping 34 is still not in contact with the end portion 32 of the first resin layer 6, and thus the chipping 34 does not cause a crack etc in the interlayer insulation film 4 etc in the element forming region 18a. Nevertheless, the WLP Flip Chip 30 is disposed of. This case occurs by determining the judgment line 33 by referencing the position of the unstable end portion 32 of the first resin layer 6. A similar case also occurs in FIG. 7.

In order to prevent such unnecessary decrease in the yield, it is essential to employ a stable reference line that is less influenced by a mask misalignment instead of using the position of the unstable end portion 32 of the first resin layer 6 as a judgment reference line for an automatic appearance inspection.

SUMMARY OF THE INVENTION

The invention provides a method of automatically inspecting a semiconductor device that includes providing a semiconductor device comprising a guard ring surrounding an element forming region, a passivation film extending from the element forming region over the guard ring and having an end portion beyond the guard ring, a passivation film removed region extending from the end portion of the passivation film to an end portion of the semiconductor device, a resin layer extending from the element forming region over the guard ring and the passivation film so as to cover the guard ring and the passivation film and to have an end portion in the passivation film removed region, a resin layer removed region in which a portion of the resin layer over the guard ring that is parallel to the end portion of the semiconductor device is removed, and a chipping extending from the end portion of the semiconductor device toward the end portion of the resin layer in the passivation film removed region, setting as a reference an end portion of the guard ring exposed in the resin layer removed region, measuring a distance y between the end portion of the guard ring and an end portion of the chipping, measuring a distance x between the end portion of the guard ring and the end portion of the resin layer, and judging the semiconductor device as non-defective when y is larger than x, or judging the semiconductor device as defective when y is equal to x or y is smaller than x.

The invention also provides a method of automatically inspecting a semiconductor device that includes providing a semiconductor device comprising a guard ring surrounding an element forming region, a passivation film extending from the element forming region over the guard ring and having an end portion beyond the guard ring, a passivation film removed region extending from the end portion of the passivation film to an end portion of the semiconductor device, a resin layer extending from the element forming region over the guard ring and the passivation film so as to cover the guard ring and the passivation film and to have an end portion in the passivation film removed region, a resin layer removed region in which a portion of the resin layer over the guard ring that is parallel to the end portion of the semiconductor device is removed, and a chipping extending from the end portion of the semiconductor device toward the end portion of the resin layer in the passivation film removed region, setting as a reference a position of a scribe line of a semiconductor wafer from which the semiconductor device is diced out, measuring a distance x between the scribe line and the end portion of the resin layer, measuring a distance y between the scribe line and an end portion of the chipping, and judging the semiconductor device as non-defective when x is larger than y, or judging the semiconductor device defective when x is equal to y or x is smaller than y.

The invention also provides a semiconductor device that includes a guard ring surrounding an element forming region, a passivation film extending from the element forming region over the guard ring and having an end portion beyond the guard ring, a passivation film removed region extending from the end portion of the passivation film to an end portion of the semiconductor device, a resin layer extending from the element forming region over the guard ring and the passivation film so as to cover the guard ring and the passivation film and to have an end portion in the passivation film removed region, a resin layer removed region in which a portion of the resin layer over the guard ring that is parallel to the end portion of the semiconductor device is removed, and a chipping extending from the end portion of the semiconductor device toward the end portion of the resin layer in the passivation film removed region.

DETAILED DESCRIPTION OF THE INVENTION

Figure 1A:
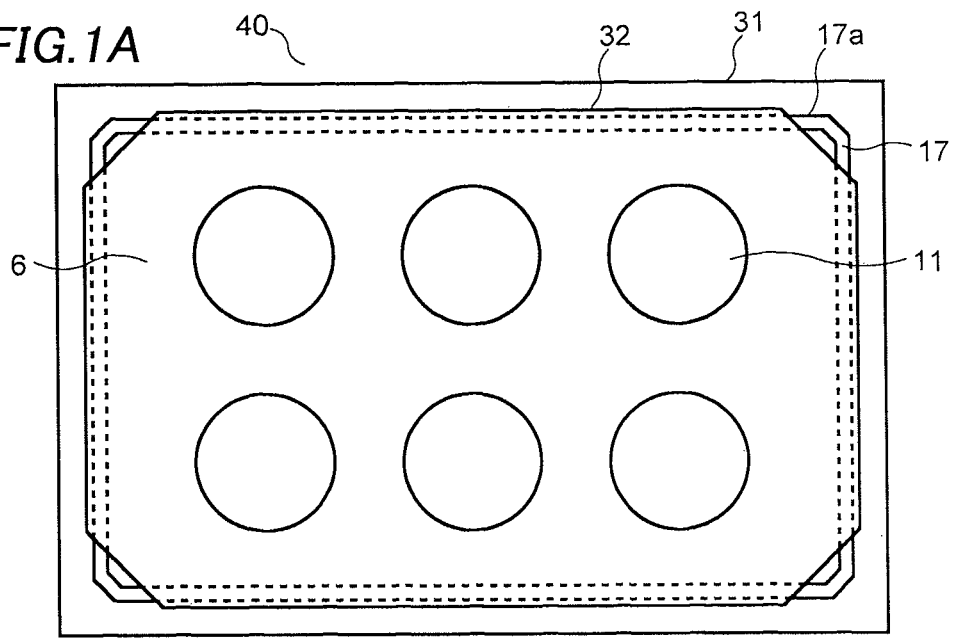
FIGS. 1A, 1B and 1C are a schematic plan view of an entire semiconductor device, enlarged plan views of an end portion of the semiconductor device and the vicinity, and views showing a method of automatically inspecting an appearance in a first embodiment of the invention.

A semiconductor device 40 and a method of automatically inspecting the appearance of a first embodiment will be described hereafter referring to FIGS. 1A to 1C. A semiconductor device 30 in a conventional method of automatically inspecting an appearance shown in FIG. 6A and the semiconductor device 40 in the method of automatically inspecting the appearance of the first embodiment shown in FIG. 1A are fundamentally the same semiconductor devices. The difference between these is that an entire guard ring 17 is covered with a first resin layer 6 in the conventional semiconductor device 30, while a portion of a guard ring 17 is exposed from a first resin layer 6 in the corner portions of the semiconductor device 40 in the semiconductor device 40 of the embodiment. The other structures are the same.

Figure 6A:
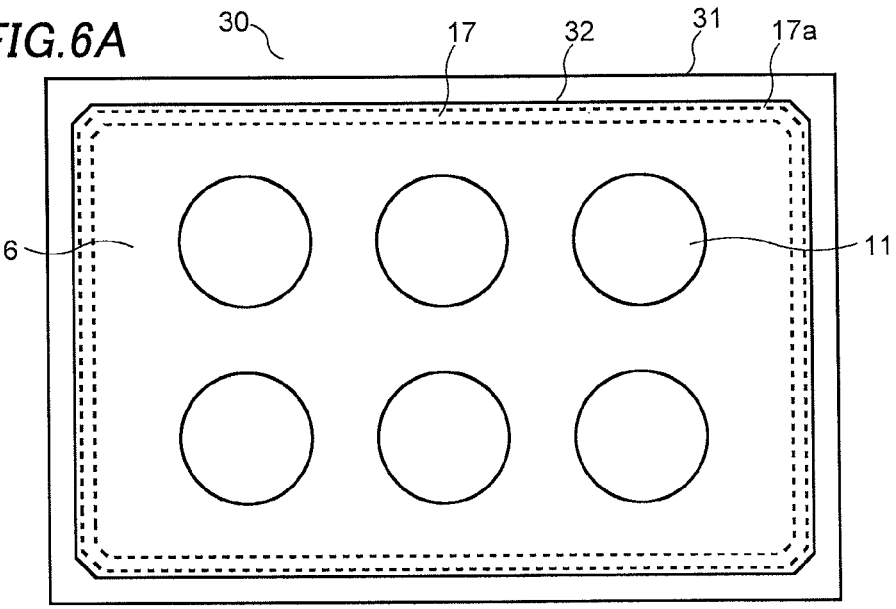
FIGS. 6A, 6B, 6C and 6D are a schematic plan view of a conventional entire semiconductor device, enlarged plan views of an end portion of the semiconductor device and the vicinity, and views showing a method of automatically inspecting an appearance.

In FIG. 1A, the reason for exposing the guard ring 17 in the corner portions of the semiconductor device 40 is to use the guard ring 17 as a reference line for an automatic appearance inspection. As shown in FIG. 6A, when the entire guard ring 17 is covered with the first resin layer 6, the first resin layer 6 prevents an automatic appearance inspection machine from recognizing the guard ring 17.

Figure 6B:
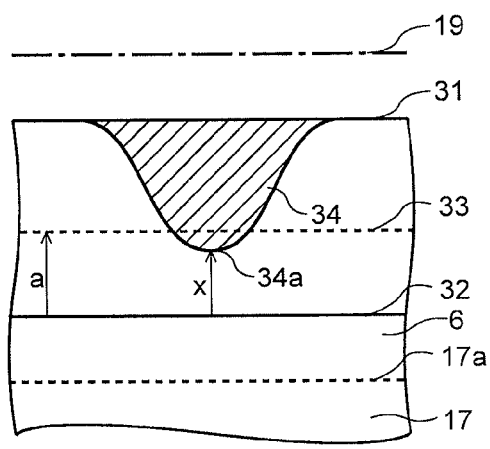
Figure 6C:
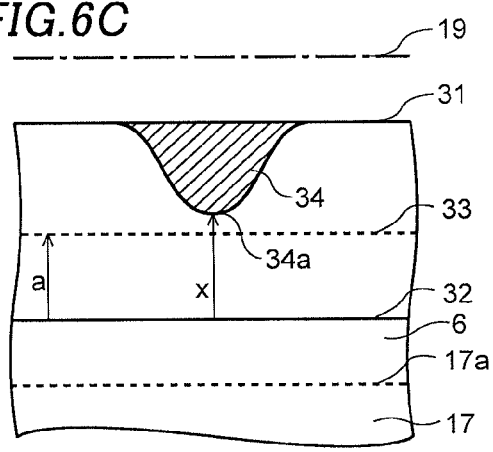
Figure 6D:
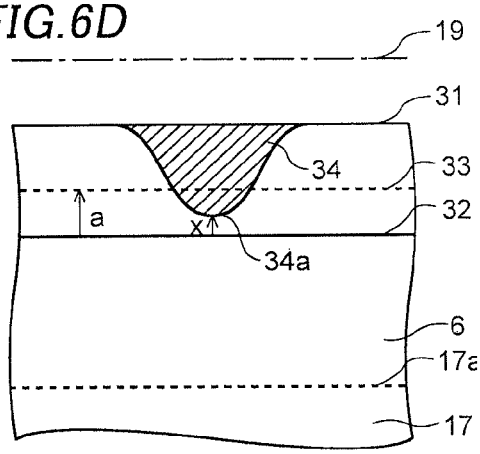

As described above, in the method of automatically inspecting the appearance of the conventional semiconductor device 30, as shown in FIGS. 6B to 6D, a distance x from the end portion 32 to an end portion 34a of a chipping 34 is recognized, and then the position of a predetermined margin a from the end portion 32 is set as a judgment line 33. When the end portion 34a of the chipping 34 lies on the judgment line 33 or lies inside the judgment line 33, the chip is judged as a defective product, and when the end portion 34a lies outside the judgment line 33, the chip is judged as a non-defective product. Therefore, there occurs a problem of judging some of non-defective chips as a defective product.

Figure 1B:
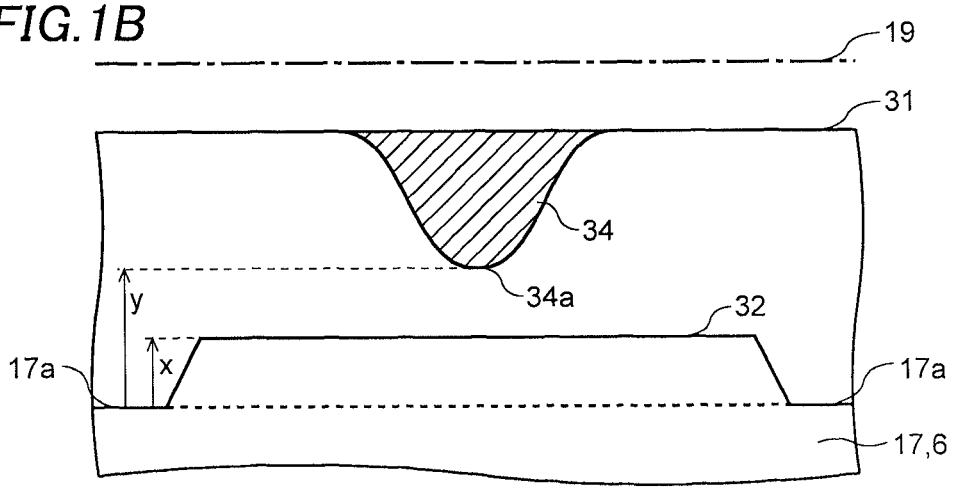
Figure 1C:
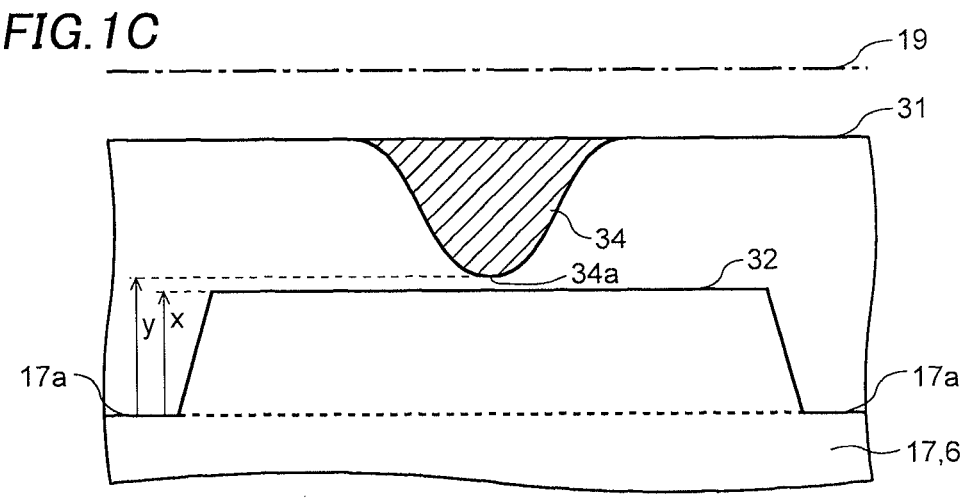

On the other hand, in the method of automatically inspecting the appearance in the first embodiment, as shown in FIGS. 1B and 1C that are partial enlarged views of an exposed portion of the guard ring 17 of FIG. 1A, a reference line for a non-defective/defective judgment by an automatic appearance inspection is a guard ring end portion 17a of the guard ring 17 on the chip end portion 31 side, that is exposed in the corner portions of the semiconductor device 40. The guard ring 17 is formed of a metal layer, formed into a reproducible and stable shape, and formed using a stepper having high mask alignment accuracy. Therefore, the distance from the chip end portion 31 to the guard ring end portion 17a is stable and highly reproducible, different from the unstable end portion 32 of the first resin layer 6.

Therefore, it is not necessary to provide a margin like in the case of using the end portion 32 of the first resin layer 6 as a judgment reference for an automatic appearance inspection. The guard ring end portion 17a exposed in the corner portion of the semiconductor device 40 is recognized, and a distance x from the guard ring end portion 17a to the end portion 32 of the first resin layer 6 and a distance y from the guard ring end portion 17a to a chipping end portion 34a are measured. When y>x, the chip is judged as an appearance non-defective product, and when y=x or y<x, the chip is judged as an appearance defective product.

Practically, when the chipping end portion 34a extends under the end portion 32 of the first resin layer 6 and y<x, the chipping is recognized as y=x since the chipping end portion 34a is difficult to recognize from the first resin layer 6 thereon.

Like in the case of FIG. 1C, even when the first resin layer 6 is formed with its end portion 32 largely extended toward the chip end portion 31 due to a mask misalignment when the first resin layer 6 is patterned and the chip is likely to be judged as an appearance defective product corresponding to FIG. 6D of the conventional art, the chip is judged as an appearance non-defective product as long as y>x. Therefore, it is prevented that an appearance non-defective product is disposed of as an appearance defective product. This is the feature of the embodiment.

Although the guard ring 17 is exposed from the first resin layer 6 in the four corner portions of the semiconductor device in the first embodiment, the guard ring 17 may be exposed in only two diagonal corner portions. This is because, as long as the guard ring 17 is exposed in two positions, the judgment of the size of a chipping is achieved on all the sides of the semiconductor substrate using the guard ring as a reference. By exposing the guard ring 17 in four positions, the judgment accuracy increases.

Furthermore, the exposed portion of the guard ring 17 is not limited to in the corner portions of the semiconductor device, and may be formed in one position or a plurality of positions on each of the sides of the semiconductor device partially. In this case, the exposed portion of the guard ring 17 is formed closer to the chipping 34, thereby increasing the judgment accuracy of the size of a chipping.

Figure 5:
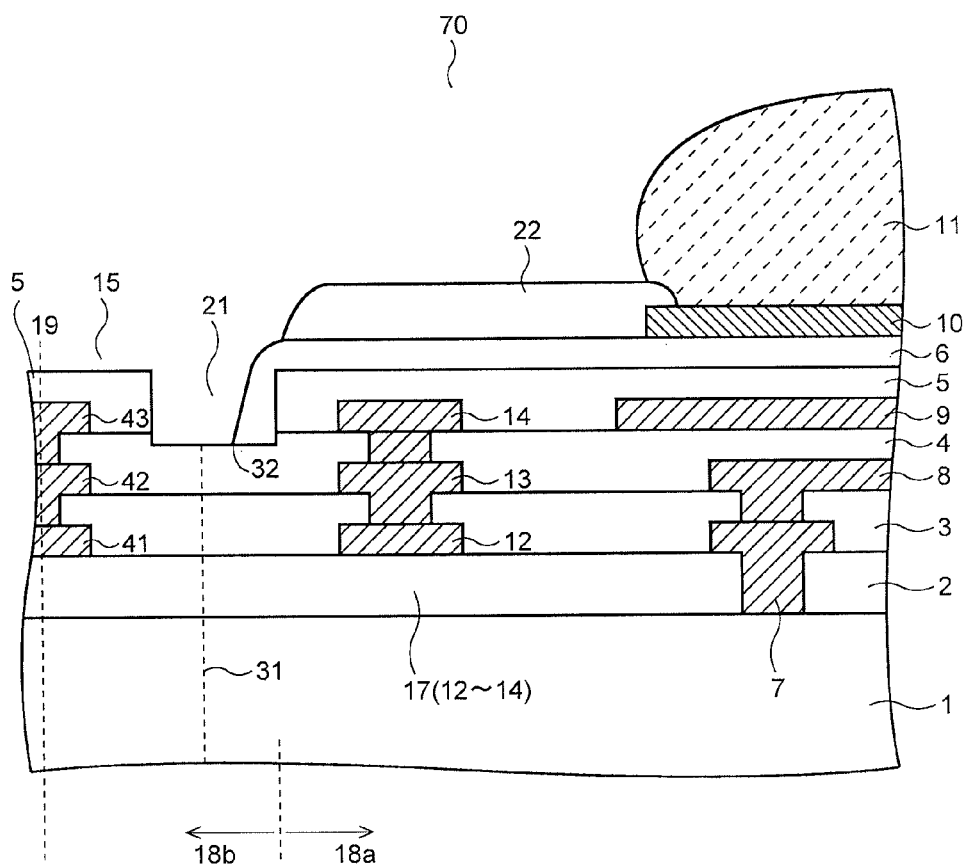
FIG. 5 is a cross-sectional view of a structure of a boundary portion between an element forming region and a scribe region of a semiconductor wafer and the vicinity including the same semiconductor device as in the first and second embodiments of the invention.
Figure 7:
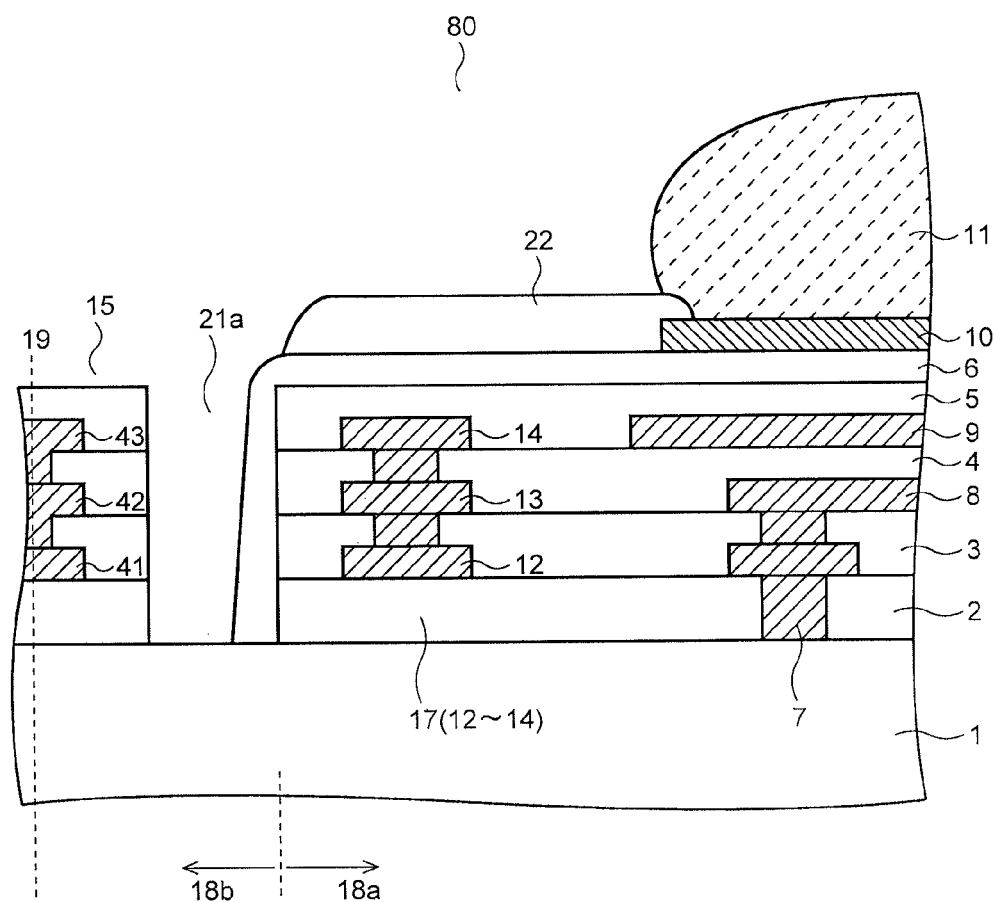
FIG. 7 is a cross-sectional view of a semiconductor wafer including a semiconductor device disclosed in Japanese Patent Application publication No. 2011-14605.

Furthermore, although the first embodiment is described about a WLP Flip Chip 40 diced from a semiconductor wafer 70 shown in FIG. 5, the similar method of inspecting an appearance is applicable to the case of a WLP Flip Chip diced from a semiconductor wafer 80 shown in FIG. 7.

Figure 2:
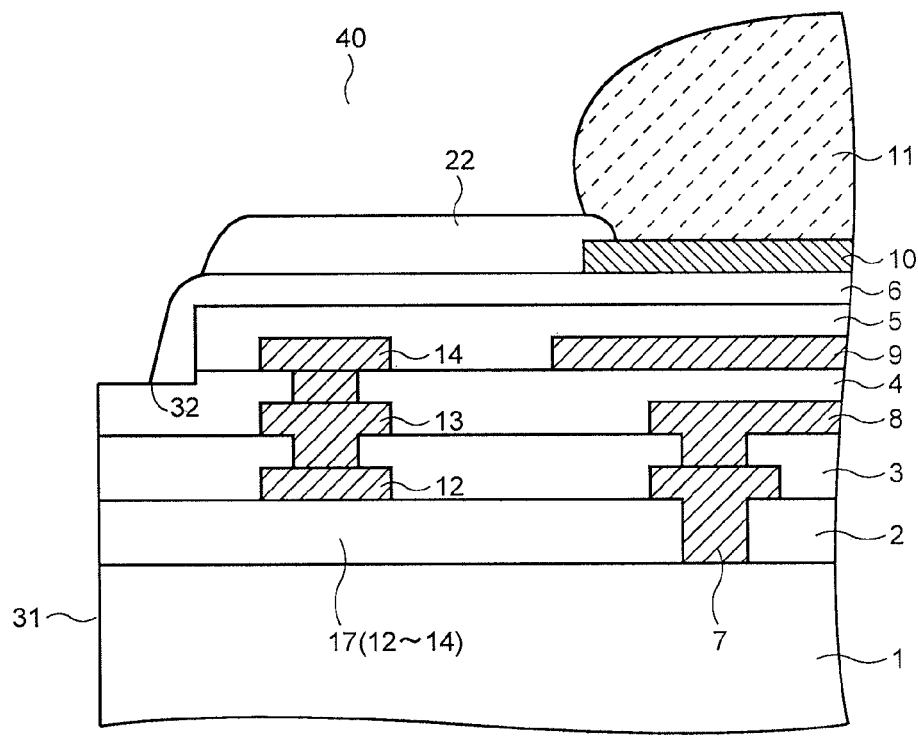
FIG. 2 is a cross-sectional view showing a structure of an end portion of the semiconductor device in the first embodiment of the invention.

A method of manufacturing a semiconductor device of the first embodiment will be described briefly referring to FIG. 5 showing a cross-sectional view of the semiconductor wafer 70 and FIG. 2 showing a cross-sectional view of the WLP Flip Chip 40 diced from the semiconductor wafer 70.

First, an insulation film 2 is formed on a semiconductor substrate 1 formed with a necessary impurity diffusion layer etc by thermal oxidation etc. A contact hole is then formed in the insulation film 2 by a predetermined photo-etching process.

Then, a first wiring layer 7 made of aluminum (Al) etc is formed on the insulation film 2 by a predetermined process, being connected to the semiconductor substrate 1 through the contact hole. At the same time, a first guard ring 12 made of aluminum (Al) etc is formed. In this case, a contact hole may be formed in the insulation film 2 and the first guard ring 12 may be connected to the semiconductor substrate 1 through the contact hole.

Then, a second insulation film 3 is deposited on the semiconductor substrate 1 including the first wiring layer 7 by a predetermined method such as a CVD method. Through-holes are formed in the second insulation film 3 by a predetermined photo-etching process, and then a second wiring layer 8 and a second guard ring 13 that are connected to the first wiring layer 7 and the first guard ring 12 respectively through the through-holes are formed by a predetermined process.

Then, a third interlayer insulation film 4 is deposited on the semiconductor substrate 1 including the second wiring layer 8 by a predetermined method such as a CVD method. A through-hole is then formed in the third interlayer insulation film 4 by a predetermined photo-etching process, and a third guard ring 14 connected to the second guard ring 13 through the through-hole is formed by a predetermined process. At the same time, a third wiring layer 9 is also formed. The third wiring layer 9 is connected to the second wiring layer 8 or the first wiring layer 7 through a through-hole (not shown).

Furthermore, in a case of a multilayered structure, the multilayered structure is formed through the similar process. In a case of a three-layered structure, a passivation film 5 formed of a silicon nitride film etc is deposited on the semiconductor substrate 1 including the third wiring layer 9 etc by a predetermined CVD method. Then, a passivation film removed groove 21 is formed in the passivation film 5 in the scribe region 18b by a predetermined photo-etching process to expose the interlayer insulation film 4 in the passivation film removed groove 21.

Then, a resin film made of polyimide etc is coated on the passivation film 5, and the first resin layer 6 extending to the passivation film removed groove 21 is formed by a predetermined photo-etching process. A rewiring layer 10 made of copper (Cu) etc is then formed in a predetermined region on the first resin layer 6 by a predetermined plating method etc. The rewiring layer 10 is connected to the third wiring layer 9 etc through a through-hole (not shown) formed in the first resin layer 6, the passivation film 5, etc.

Then, a resin film made of polyimide etc is coated on the semiconductor substrate 1 including the first resin layer 6, and a second resin layer 22 is formed by a predetermined photo-etching process, extending to outside the guard ring 17 and having an opening in a portion on the rewiring layer 10. Finally, a solder bump 11 etc is formed on the rewiring layer 10 partially exposed from the second resin layer 22 by a plating method etc.

Then, the semiconductor wafer 70 is diced along the scribe line 19 as the center line to obtain the WLP Flip Chip 40 shown in FIG. 2. FIG. 1A is a plan view of the WLP Flip Chip 40. The diced WLP Flip Chips 40 undergo an appearance inspection by an automatic appearance inspection machine in the described procedure, and some of the WLP Flip Chips 40 judged as an appearance defective product are removed.

When a reliability test such as PCT (Pressure Cooker Test) is performed to the WLP Flip Chip of the first embodiment, the result is well compared with a conventional chip and confirms that there is no practical problem in the reliability. Although the sidewall of the element forming region 18a is not covered with the first resin layer 6 etc, the outermost periphery of the element forming region 18a is surrounded by the guard ring 17 and it is conceived that this contributes to the reliability.

Figure 3:
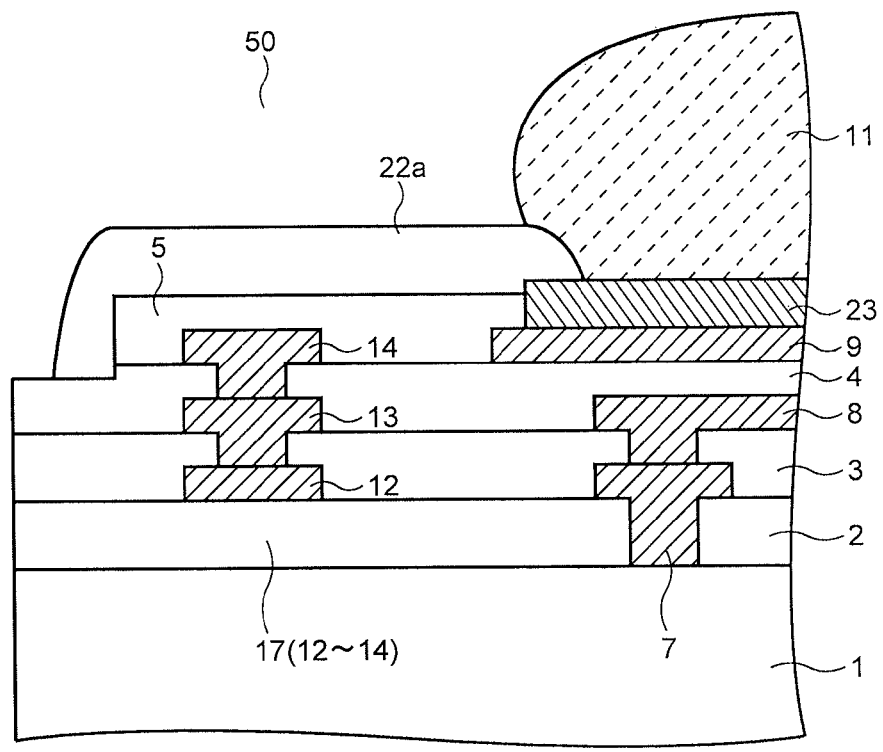
FIG. 3 is a cross-sectional view showing a structure of an end portion of a semiconductor device in other embodiment of the invention.

FIG. 3 is an embodiment where the first resin layer 6 in FIG. 2 does not exist and a resin layer 22a is directly formed on the passivation film 5. First, an opening is formed in the passivation film 5 by a predetermined photo-etching process to expose a portion of the third wiring layer 9. Then, a nickel (Ni) layer etc is plated on the exposed third wiring layer 9, and a gold (Au) layer is further plated on the nickel (Ni) layer etc by a predetermined plating method, thereby forming a plating electrode 23 of which the surface layer is the gold (Au) layer. The plating electrode 23 corresponds to the rewiring layer 10 in FIG. 2.

Then, a resin film made of polyimide etc is coated on the passivation film 5 including the plating electrode 23, and the resin layer 22a having an opening in a portion on the plating electrode 23 and extending to the passivation film removed groove 21 is formed by a predetermined photo-etching process. The solder bump 11 etc is then formed on the plating electrode 23 by a predetermined plating method etc, and then the semiconductor wafer is diced using the scribe line 19 as a center line, thereby obtaining a WLP Flip Chip 50 shown in FIG. 3. Finally, as described above, the chip is judged as a non-defective product or a defective product by an automatic appearance inspection machine.

Figure 4A:
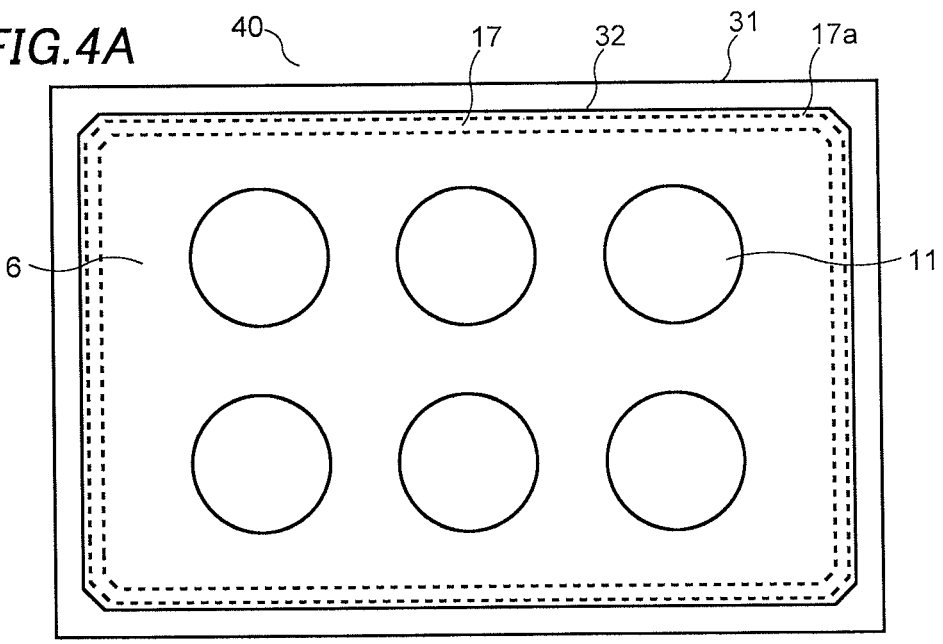
FIGS. 4A and 4B are a schematic plan view of an entire semiconductor device, an enlarged plan view of an end portion of the semiconductor device and the vicinity, and views showing a method of automatically inspecting an appearance in a second embodiment of the invention.
Figure 4B:
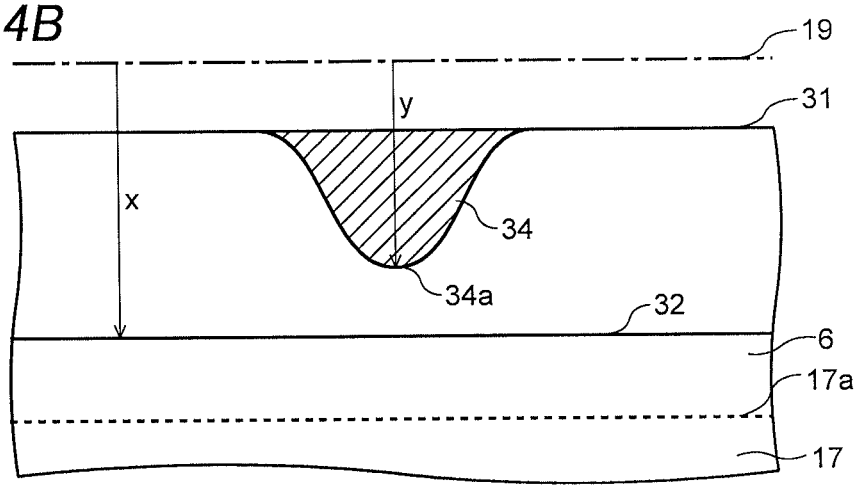

A second embodiment will be described hereafter referring to FIGS. 4A and 4B. FIGS. 4A and 4B differ from the FIGS. 6A to 6D of a conventional art in that a reference line for an appearance non-defective or defective judgment by a method of automatically inspecting an appearance is a scribe line 19 that is the center line of the dicing region determined when designed in FIG. 4B. The WLP Flip Chips 30 in FIG. 4A and FIG. 6A have the same structures.

Although the chip end portion 31 may be a reference line, the position of the chip end portion 31 largely varies depending on a dicing blade width or a dicing condition. Therefore, a margin is necessary like in the case where the end portion 32 of the first resin layer 6 is used as a reference line.

On the other hand, since the position of the scribe line 19 when designed is fixed, as shown in FIG. 4B, a distance y from the scribe line 19 to the chipping end portion 34a and a distance x from the scribe line 19 to the end portion 32 of the first resin layer 6 are measured, and the chip is judged as an appearance non-defective product when x>y, and the chip is judged as an appearance defective product when x=y or x<y.

The methods of inspecting the appearance of the semiconductor device of the embodiments are also applicable to the WLP Flip Chip 30 diced from the semiconductor wafer 70 shown in FIG. 7.

The semiconductor device and the method of automatically inspecting the appearance of the invention achieves proper judgment of a non-defective or defective product on a semiconductor device with a chipping occurring from an end portion toward the element forming region, and prevents an appearance non-defective product from being judged as an appearance defective product.

What is claimed is:

1. A method of automatically inspecting a semiconductor device, comprising:

providing a semiconductor device comprising a guard ring surrounding an element forming region, a passivation film extending from the element forming region over the guard ring and having an end portion beyond the guard ring, a passivation film removed region extending from the end portion of the passivation film to an end portion of the semiconductor device, a resin layer extending from the element forming region over the guard ring and the passivation film so as to cover the guard ring and the passivation film and to have an end portion in the passivation film removed region, a resin layer removed region in which a portion of the resin layer over the guard ring that is parallel to the end portion of the semiconductor device is removed, and a chipping extending from the end portion of the semiconductor device toward the end portion of the resin layer in the passivation film removed region;

setting as a reference an end portion of the guard ring exposed in the resin layer removed region;

measuring a distance y between the end portion of the guard ring and an end portion of the chipping;

measuring a distance x between the end portion of the guard ring and the end portion of the resin layer; and judging the semiconductor device as non-defective when y is larger than x, or judging the semiconductor device as defective when y is equal to x or y is smaller than x.

2. The method of claim 1, wherein, in the semiconductor device, the resin layer removed region is formed at a pair of corners of the semiconductor device aligned in a diagonal direction.

3. The method of claim 1, wherein the semiconductor device further comprises a second resin layer covering the resin layer inside the end portion of the resin layer.

4. The method of claim 1, wherein the semiconductor device further comprises an interlayer insulation film exposed in the passivation film removed region, and wherein the chipping comprises a portion of the interlayer insulation film or a portion of a semiconductor substrate.

5. The method of claim 1, wherein, in the semiconductor device, a semiconductor substrate is exposed in the passivation film removed region, and the chipping comprises a portion of the semiconductor substrate.

6. The method of claim 1, wherein the semiconductor device comprises a WLP Flip Chip.

7. The method of claim 1, wherein the guard ring comprises a metal layer.

8. A method of automatically inspecting a semiconductor device, comprising:

providing a semiconductor device comprising a guard ring surrounding an element forming region, a passivation film extending from the element forming region over the guard ring and having an end portion beyond the guard ring, a passivation film removed region extending from the end portion of the passivation film to an end portion of the semiconductor device, a resin layer extending from the element forming region over the guard ring and the passivation film so as to cover the guard ring and the passivation film and to have an end portion in the passivation film removed region, a resin layer removed region in which a portion of the resin layer over the guard ring that is parallel to the end portion of the semiconductor device is removed, and a chipping extending from the end portion of the semiconductor device toward the end portion of the resin layer in the passivation film removed region;

setting as a reference a position of a scribe line of a semiconductor wafer from which the semiconductor device is diced out;

measuring a distance x between the scribe line and the end portion of the resin layer;

measuring a distance y between the scribe line and an end portion of the chipping; and judging the semiconductor device as non-defective when x is larger than y, or judging the semiconductor device defective when x is equal to y or x is smaller than y.

9. The method of claim 8, wherein the semiconductor device further comprises a second resin layer covering the resin layer inside the end portion of the resin layer.

10. The method of claim 8, wherein the semiconductor device further comprises an interlayer insulation film exposed in the passivation film removed region, and wherein the chipping comprises a portion of the interlayer insulation film or a portion of a semiconductor substrate.

11. The method of claim 8, wherein, in the semiconductor device, a semiconductor substrate is exposed in the passivation film removed region, and the chipping comprises a portion of the semiconductor substrate.

12. The method of claim 8, wherein the semiconductor device comprises a WLP Flip Chip.

13. The method of claim 8, wherein the guard ring comprises a metal layer.

14. A semiconductor device comprising:

a guard ring surrounding an element forming region;

a passivation film extending from the element forming region over the guard ring and having an end portion beyond the guard ring;

a passivation film removed region extending from the end portion of the passivation film to an end portion of the semiconductor device;

a resin layer extending from the element forming region over the guard ring and the passivation film so as to cover the guard ring and the passivation film and to have an end portion in the passivation film removed region;

a resin layer removed region in which a portion of the resin layer over the guard ring that is parallel to the end portion of the semiconductor device is removed;

a chipping extending from the end portion of the semiconductor device toward the end portion of the resin layer in the passivation film removed region; and wherein the resin layer removed region is formed at a pair of corners of the semiconductor device aligned in a diagonal direction.

15. The semiconductor device of claim 14, further comprising an interlayer insulation film exposed in the passivation film removed region, and wherein the chipping comprises a portion of the interlayer insulation film or a portion of a semiconductor substrate.

16. The semiconductor device of claim 14, wherein a semiconductor substrate is exposed in the passivation film removed region, and the chipping comprises a portion of the semiconductor substrate.

17. The semiconductor device of claim 14, wherein the semiconductor device comprises a WLP Flip Chip.

18. The method of claim 14, wherein the guard ring comprises a metal layer.

19. The method of claim 14, wherein the resin layer comprises a polyimide layer.

* * * * *